United States Patent [19]

McKibben

[11] Patent Number: 4,633,144
[45] Date of Patent: Dec. 30, 1986

[54] DYNAMIC FOCUS SIGNAL SHAPER

[75] Inventor: Barry A. McKibben, Beaverton, Oreg.

[73] Assignee: Tektronix, Inc., Beaverton, Oreg.

[21] Appl. No.: 642,231

[22] Filed: Aug. 20, 1984

[51] Int. Cl.⁴ .............................................. H01J 29/58
[52] U.S. Cl. ...................................... 315/382; 315/393
[58] Field of Search ...................... 315/382, 382.1, 395, 315/393, 370, 371; 358/218; 364/742, 855

[56] References Cited

U.S. PATENT DOCUMENTS 3,961,223  6/1976  Ray et al. .............................. 315/371
4,249,112  2/1981  McKibben .......................... 315/370

Primary Examiner—Theodore M. Blum
Assistant Examiner—Gregory C. Issing
Attorney, Agent, or Firm—John P. Dellett; John Smith-Hill; Robert S. Hulse

[57] ABSTRACT

A dynamic signal shaper for a cathode ray tube display system is described. In some cathode ray tubes an electromagnetic lens is driven by a correction signal derived from the beam deflection signals. The required correction signal is proportional to the product of the squares of the horizontal and vertical deflection signals. The described signal shaper incorporates means for making the constant of proportionality independently adjustable for beam deflections in each corner of cathode ray tube screen.

18 Claims, 3 Drawing Figures

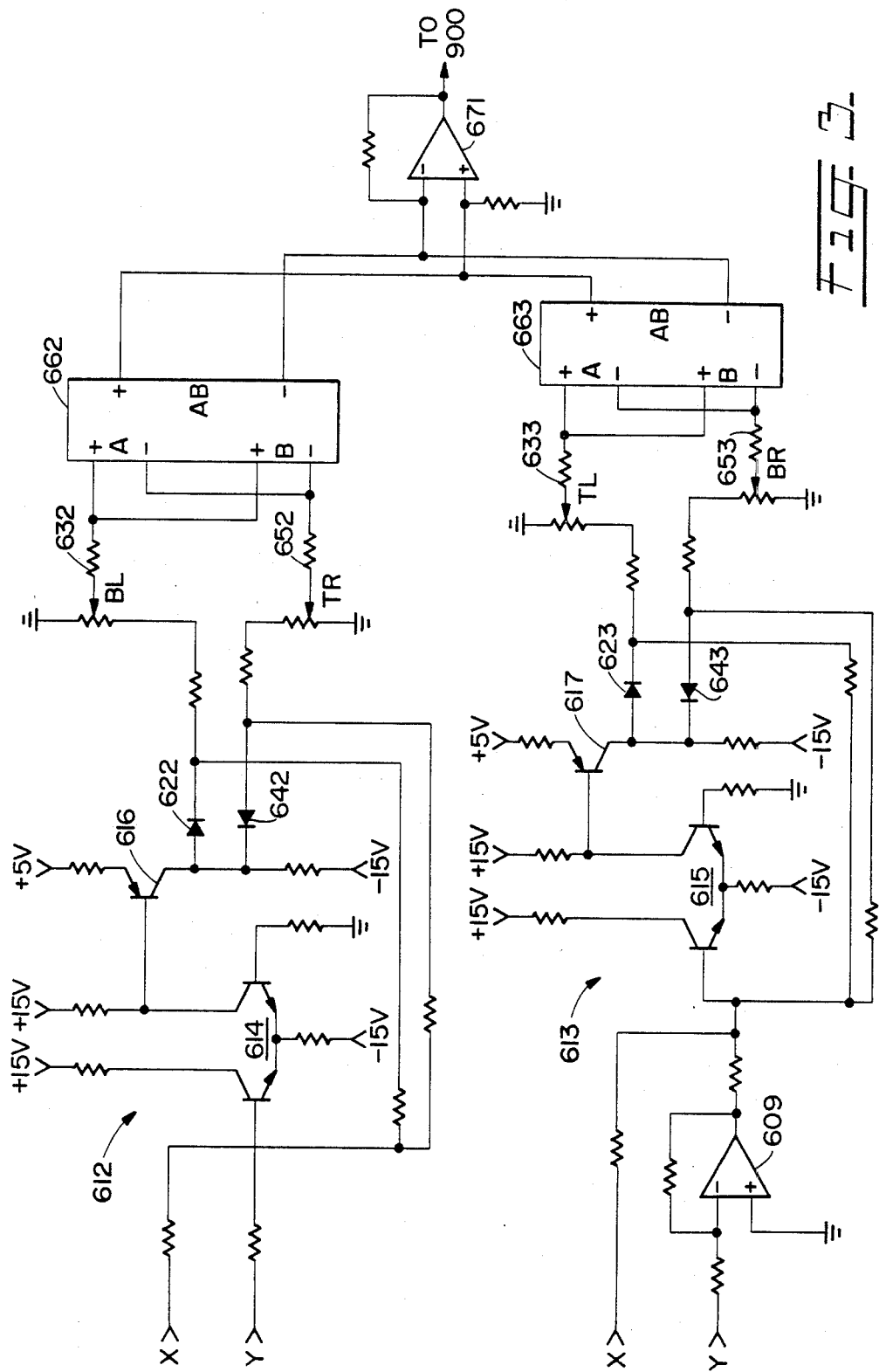

DYNAMIC FOCUS SIGNAL SHAPER

BACKGROUND OF THE INVENTION

The present invention relates to cathode-ray-tube circuits in general, and in particular to a dynamic focus signal shaper circuit for a cathode-ray-tube having an electrostatic or electromagnetic focusing lens.

The focusing of an electron beam by electric or magnetic fields in a cathode-ray-tube, hereinafter abbreviated CRT, is closely analogous to the focusing of light rays in an optical system. Not surprisingly, the electro-optical system of a CRT is plagued by distortions very similar to those which plague optical systems.

One of the more troublesome distortions is defocusing. As an electron beam leaves the cathode of a CRT, it is comparatively broad. A focusing lens, situated between the cathode and the CRT system screen, is adjusted to cause the beam to converge to a tight spot as it reaches the screen. The lens adjustment depends on the distance the beam must travel to the screen. In most CRT's the distance a beam must travel varies with the distance of deflection of the beam from screen center. Thus if a focusing lens is adjusted to provide good focus at screen center, the beam will be defocused when deflected from center.

To solve this problem focusing lenses, driven by a focusing signal from a dynamic focus signal shaper, are designed to dynamically change focal length. The dynamic focus signal shaper typically derives the focusing signal from signals proportional to beam deflection. The required focusing signal is approximately proportional to the square of the distance of deflection from screen center and is thus greatest at the corners of a rectangular CRT. Due to manufacturing tolerances, the effective focal length deviates from the square of the distance from screen center in a non-symmetrical fashion.

To accommodate these non-symmetrical variations in focal length for beam deflections in the $+X$, $+Y$, $-X$ and $-Y$ directions from center, previous schemes for dynamic focus signal shapers have provided for independent focus adjustment of each edge of a rectangular CRT display. Corner focus is then extrapolated from center and adjacent edge values. If the resulting corner focus is not adequate, further improvement in corner focus requires interactive compromising of adjacent edge focus. Under this scheme, optimization of corner focus is often difficult.

What is needed then, is a dynamic focus signal shaper for a rectangular CRT for producing a focusing signal proportional to the square of the distance of deflection of the beam from display center and permitting independent focus adjustment of each corner of the display. Edge focus is then interpolated from adjacent corner focus. Previously issued U.S. Pat. No. 4,429,112 discloses a related concept for astigmatism correction but does not disclose an implementing circuit. The article "Correction of Deflection-Abberations by Analog Computer" by K. Schlesinger and R. A. Wagner in Vol. 112, No. 8 IEEE *Transactions on Electron Devices*, herein incorporated by reference, describes a system for dynamic control of focus using a complex analog computer to generate the necessary signals to correct the display. The circuits of Schlesinger and Wagner, however, contain no provision for independent adjustment of corner focus.

SUMMARY OF THE INVENTION

According to the present invention a dynamic focus signal shaper receives horizontal (X) and vertical (Y) signals proportional to the amount of horizontal and vertical deflection of a CRT beam from screen center. Horizontal deflection voltage X is a positive value for deflection the the right and a negative value for deflection to the left. Vertical deflection voltage Y has a positive value for deflection above screen center and a negative value for deflection below screen center. X and Y are scaled such that the absolute value of X and the absolute value of Y are equal when the beam is at any corner.

The X and Y signals are applied to the inputs of a first summer with output proportional to $X+Y$. The X and Y signals are also applied to the inputs of a differential means with output proportional to $Y-X$. The output of the first summer is applied to a first and second limiter, while the output of the differential means is applied to a third and fourth limiter. The first and third limiters have unity gain for inputs greater than zero and zero gain for inputs less than zero. The second and fourth limiters have unity gain for inputs less than zero and zero gain for inputs greater than zero.

Each output signal of the first and second limiters is applied through associated first and second variable gain controls to a first differential-input, four quadrant multiplier having an output proportional to $(X+Y)^2$. Similarly, each output signal of the third and fourth limiters is applied through associated third and fourth variable gain controls to a second differential-input, four quadrant multiplier having an output proportional to $(Y-X)^2$. The output signal of each multiplier is applied to a second summer. The output signal of the second summer (the focusing signal) is thus proportional to $(X^2+Y^2)$.

Each of the four variable gain controls independently controls beam focus adjustment for a particular corner of the display. To focus the CRT display, the beam is directed in turn at each corner of the display and independently focused by operation of the appropriate gain control. When the beam is directed to an edge of the display or to an interior position, focus signal gain is interpolated from a combination of the two nearest gain control settings on a weighted basis.

It is therefore an object of my invention to provide a simple method for generating a focus correction signal in a dynamic focus correction system.

It is another object of my invention to provide a focus correction signal shaper allowing independent focus adjustment for each corner of the CRT display.

The invention resides in the combination, construction, arrangement and disposition of the various component parts and elements incorporated in a dynamic focus signal shaper constructed in accordance with the principles of this invention. The present invention will be better understood and objects and important features other than those specifically enumerated above will become apparent when consideration is given to the following details and description, which when taken in conjunction with the annexed drawing describes, discloses, illustrates, and shows a preferred embodiment or modification of the present invention and what is presently considered and believed to be the best mode of practicing the principles thereof. Other embodiments or modifications may be suggested to those having the benefit of the teachings herein, and such other embodiments or modifications are intended to be reserved especially if they fall within the scope and spirit of the subjoined claims.

DESCRIPTION OF THE DRAWINGS

FIG. 3 is a combination schematic and block diagram of an alternate embodiment of the present invention.

DETAILED DESCRIPTION OF THE PREFERRED EMBODIMENT

Figure 1:
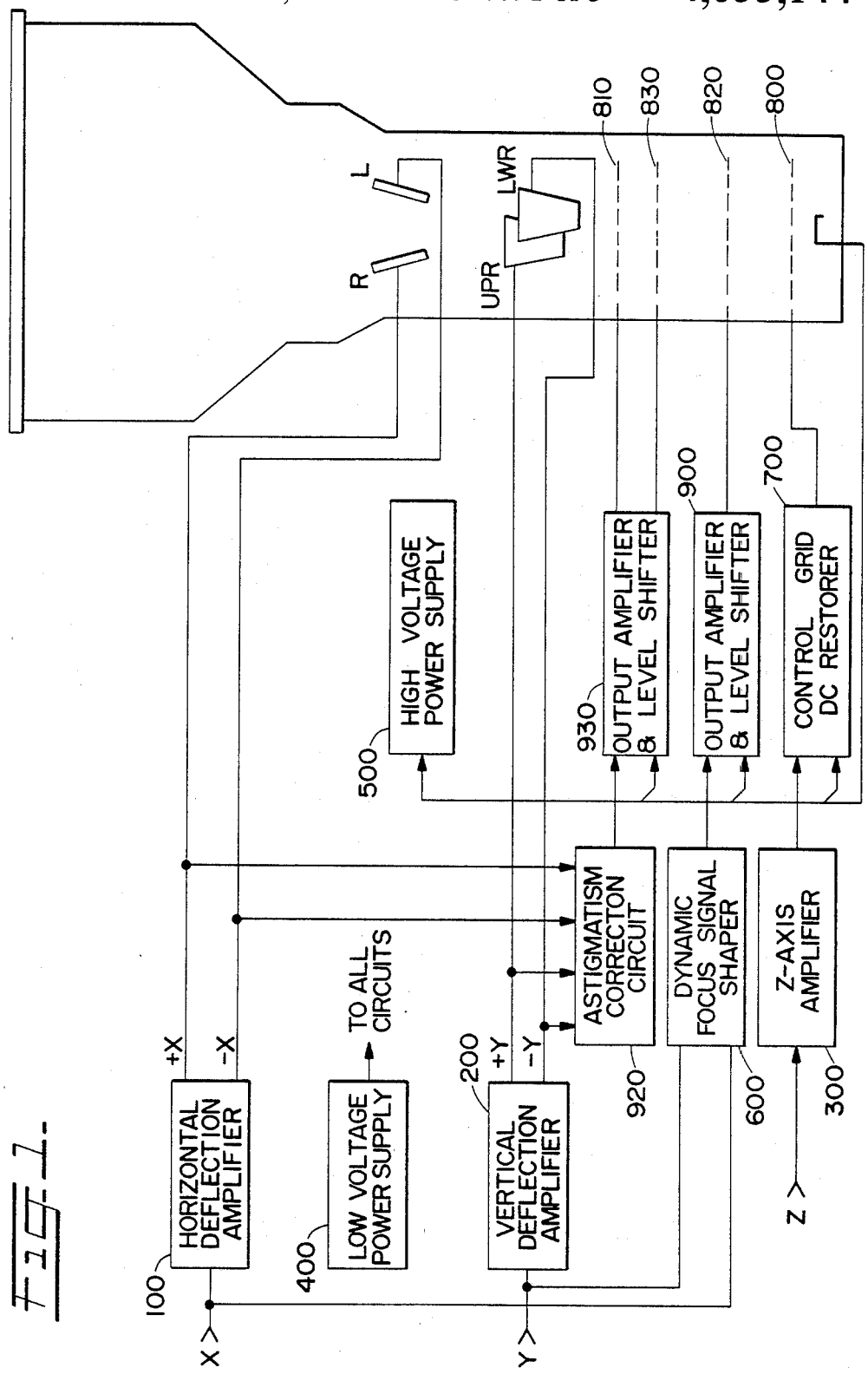
FIG. 1 is the block diagram of a display system in which the present invention may be incorporated.

FIG. 1 illustrates an X—Y display system incorporating my invention as an aid to understanding the general environment in which my invention functions.

Horizontal (X) and vertical (Y) signals to be displayed on CRT 800 are first fed to deflection amplifiers 100 and 200. The deflection amplifiers process the input signals and provide push-pull outputs to drive the deflection plates of CRT 800. Each deflection amplifier may contain gain and position controls. Z-axis amplifier 300 controls display intensity by providing a voltage to the control grid d.c. restorer circuit 700. An external intensity control is usually provided to control the static brightness of the display. Astigmatism correction circuit 920, operating through output amplifier and level shifter 930, controls stigmators 810 and 830 to provide astigmatism correction when the beam is deflected from the center of the CRT 800 screen.

Dynamic focus signal shaper 600, operating through output amplifier and level shifter 900, controls focus element 820, an electrostatic focusing lens. Low-voltage and high-voltage power supplies, 400 and 500 respectively, provide all the voltages necessary for display system operation.

Figure 2:
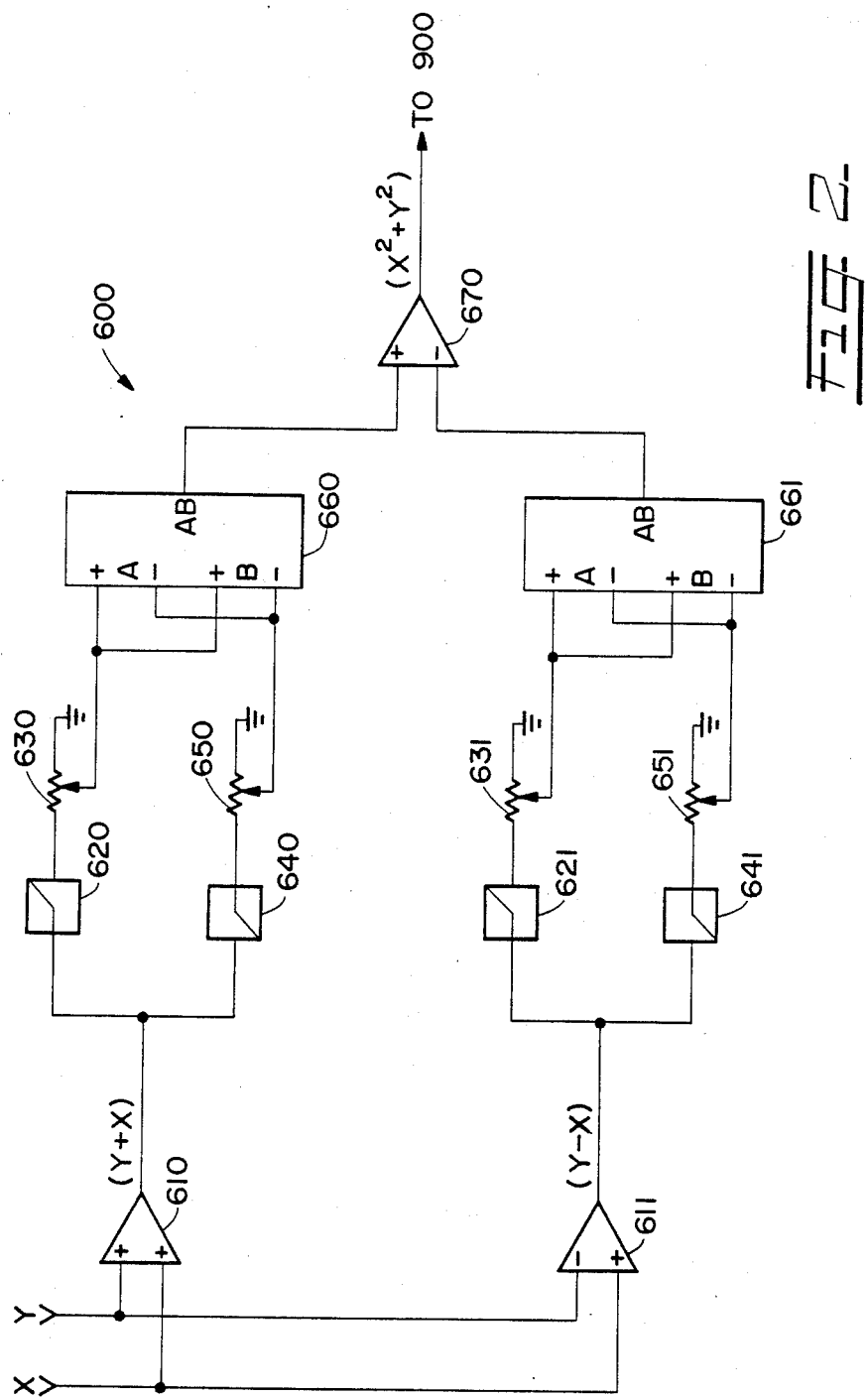
FIG. 2 is a block diagram of the preferred embodiment of the present invention.

FIG. 2 is a block diagram of dynamic focus signal shaper 600 according to my invention. Horizontal deflection voltage X, is proportional to the amount of horizontal deflection of the beam from CRT 800 screen center. X is a positive value for deflections to the right and a negative value for deflections to the left. Vertical deflection voltage Y is proportional to the amount of vertical deflection of the beam from screen center. Y has a positive value for deflections above screen center and a negative value for deflections below screen center. X and Y are scaled such that the absolute value of X and the absolute value of Y are equal when the beam is at any corner.

The X and Y signals are applied to the inputs of summer 610 having an output proportional to $X+Y$. The X and Y signals are also applied to the inputs of differential means 611 having an output proportional to $Y-X$. The output of summer 610 is applied to limiters 620 and 640 while the output of differential means 611 is applied to limiters 621 and 641. Limiters 620 and 621 have unity gain for inputs greater than zero and zero gain for inputs less than zero and limiters 640 and 641 have unity gain for inputs less than zero and zero gain for inputs greater than zero.

The output of limiter 620 is applied to the $+A$ and $+B$ inputs of multiplier 660 through gain control 630. The output of limiter 640 is applied to the $-A$ and $-B$ inputs of multiplier 660 through gain control 650. Similarly, the output of limiter 621 is applied to the $+A$ and $+B$ inputs of multiplier 661 through gain control 631 and the output of limiter 641 is applied to the $-A$ and $-B$ inputs of multiplier 661 through gain control 651. The multiplier outputs are proportional to the product of the net A and B inputs. The net A input is equal to the difference between the $+A$ and $-A$ inputs. The net B input is equal to the difference between the $+B$ and $-B$ inputs.

When the beam is in the top right corner of the rectangular CRT display, X and Y are equal and greater than zero. Limiters 621, 640 and 641 have zero output. Limiter 620 has an output proportional to $X+Y$. The output of multiplier 660 is thus proportional to $(X+Y)^2$ with magnitude adjustable only by gain control 630. For $X=Y$, it is noted the multiplier output is also proportional to $X^2+Y^2$.

When the beam is in the bottom left corner of the CRT display, X and Y are equal and less than zero. Limiters 620, 621 and 641 have zero outputs. Limiter 640 has an output proportional to $X+Y$. In this case the output of multiplier 660 is also proportional to $(X+Y)^2$ but with magnitude adjustable only by gain control 650.

In a similar fashion it can be shown that when the beam is at the top left corner of the CRT display the output of multiplier 661 is proportional to $(Y-X)^2$ with magnitude adjustable only by gain control 641. Finally, when the beam is at the bottom right corner, the output of multiplier 661 is proportional to $(Y-X)^2$ with magnitude adjustable only by gain control 651. Again, for $X=-Y$ the multiplier 661 output is proportional to $X^2+Y^2$.

The outputs of multipliers 660 and 661 are applied to summer 670. The output of summer 670, the focusing signal, is thus proportional to $(Y-X)^2+(Y+X)^2$ or, equivalently, proportional to $X^2+Y^2$ for all beam positions. Since the beam deflection is proportional to the square root of $X^2+Y^2$, the focusing signal is proportional to the square of the beam deflection, as desired. The constant of proportionality is independently adjustable for beam deflections at each corner of the display through gain controls 630, 631, 650 and 651.

To focus the CRT display, the beam is directed at each corner or the display and independently focused by operation of the appropriate gain control. When the beam is directed to an edge of the display, or to an interior position (except along display diagonals), the dynamic signal shaper then automatically determines focus adjustment from displacement signals with focusing signal gain control settings on a weighted basis. Along display diagonals, focusing signal gain is affected solely by the setting of the gain control associated with the nearest corner.

FIG. 3 is a combination detail schematic and block diagram of an embodiment of the present invention generally similar to that shown in FIG. 2 but with a number of signal inversions to minimize component count. Here the X and Y signals are applied to the noninverting input of differential amplifier 614. The amplifier output is inverted by transistor 616 and resistively fed back to amplifier 614 input through diode limiters 622 and 642. Amplifier 614 and transistor 616 form inverting summer 612. The outputs of limiters 622 and 642 are connected to multiplier 662 through variable resistor gain controls 632 and 652.

The X and the Y signals are also applied to the noninverting input of differential amplifier 615 with the Y signal being first inverted by inverting amplifier 609. The differential amplifier 615 output is inverted by transistor 617 and resistively fed back to amplifier 615 input through diode limiters 623 and 643. Amplifier 615, transistor 617 and inverter 609 thus form differential amplifier 613.

The output of inverting summer 612, proportional to $-(X+Y)$, is applied to the A and B inputs of multiplier 662 through diode limiters 622 and 642 and variable resistor gain controls 632 and 652. The output of differential amplifier 613, proportional to $(Y-X)$, is applied to the A and B inputs of multiplier 663 through diode limiters 623 and 643 and variable resistor gain controls 633 and 653. Multipliers 662 and 663, in the preferred embodiment, may each be a Motorola model MC1495, a four-quadrant, differential input multiplier. The output of multiplier 662, proportional to $(X+Y)^2$, and the output on multiplier 663, proportional to $(X-Y)^2$, are summed by operational amplifier 671. The output of amplifier 671, the focusing signal, is thus proportional to $X^2+Y^2$.

As was shown for the block diagram of FIG. 2, it can be shown that variable controls 632, 652, 633 and 653 provide independent control of corner focus for bottom left, top right, top left and bottom right corners respectively.

While several embodiments of the invention are shown and described, it will be apparent to those skilled in the art that many other changes and modifications may be made without departing from the invention in its broader aspects. For instance, the operations of inverting, summing, limiting, gain control and multiplying signals may be accomplished in many ways, obvious to those skilled in the art, other than as depicted herein. Also, referring to FIG. 2, the invention will function with the gain controls placed either at the outputs or the inputs to the limiters. It is therefore intended the appended claims cover all such changes and modifications as fall within the true spirit and scope of the invention.

I claim:

1. A dynamic focusing signal shaper for generating a signal for adjusting focus in the corners of a cathode-ray-tube screen, the shaper comprising:
   a source of horizontal deflection signal,
   a source of vertical deflection signal,
   means for summing the horizontal and vertical deflection signals,
   means for differencing the horizontal and vertical deflection signals,
   a first multiplier for multiplying the output of the summing means,
   a second multiplier for multiplying the output of the differencing means, and
   means for adding the outputs of the first and second multipliers and outputting the focus adjustment signal.

2. A dynamic focusing signal shaper for generating a signal for adjusting focus in the corners of a cathode-ray-tube screen, the shaper comprising:
   a source of horizontal deflection signal,
   a source of vertical deflection signal,
   means for summing the horizontal and vertical deflection signals,
   means for differencing the horizontal and vertical deflection signals,
   a first and second limiter coupled to receive the output of the summing means,
   a third and fourth limiter coupled to receive the output of the differencing means,
   a first multiplier coupled to receive and multiply the outputs of the first and second limiters,
   a second multiplier coupled to receive and multiply the outputs of the third and fourth limiters, and
   means for adding the outputs of the first and second multipliers and outputting the focus adjustment signal.

3. A dynamic focusing signal shaper according to claim 2 wherein the first and third limiters have a gain of one for inputs greater than zero and a gain of zero for inputs less than zero and wherein the second and fourth limiters have a gain of zero for inputs greater than zero and a gain of one for inputs less than zero.

4. A dynamic focusing signal shaper according to claim 3 wherein the limiters comprise diodes.

5. A dynamic focusing signal shaper according to claim 3 including means for independently scaling the values provided by said limiters.

6. A dynamic focusing signal shaper for generating a signal for adjusting focus in the corners of a cathode-ray-tube screen, the shaper comprising:
   a source of horizontal deflection signal,
   a source of vertical deflection signal,
   means for summing the horizontal and vertical deflection signals,
   means for differencing the horizontal and vertical deflection signals,
   first and second limiters coupled to receive the output of the summing means,
   third and fourth limiters coupled to receive the output of the differencing means,
   means for independently scaling the outputs of the first, second, third and fourth limiters,
   a first multiplier coupled to receive and multiply the outputs of the first and second limiters,
   a second multiplier coupled to receive and multiply the outputs of the third and fourth limiters, and
   means for adding the outputs of the first and second multipliers and outputting the focus adjustment signal.

7. A dynamic focus signal shaper for generating a signal for adjusting focus in the corners or a cathode-ray-tube screen, the shaper comprising:
   a source of horizontal deflection signal,
   a source of vertical deflection signal,
   means for summing the horizontal and vertical deflection signals,
   means for differencing the horizontal and vertical deflection signals,
   first and second limiters coupled to receive the output of the summing means,
   third and fourth limiters coupled to receive the output of the differencing means,
   a first, a second, a third and a fourth gain controller coupled to receive the outputs of the first, second, third and fourth limiting means respectively,
   a first multiplier coupled to receive and multiply the outputs of the first and second gain controllers,
   a second multiplier coupled to receive and multiply the outputs of the third and fourth gain controllers, and
   means for adding the outputs of the first and second multipliers for outputting the focus adjustment signal.

8. A dynamic focus signal shaper according to claim 7 wherein the gain controllers comprise variable resistors.

9. A dynamic focusing signal shaper for generating a signal for adjusting focus on the corners of a cathode-ray-tube screen, the shaper comprising:

a source of horizontal deflection signal,
a source of vertical deflection signal,
means for summing the horizontal and vertical deflection signals,
means for differencing the horizontal and vertical deflection signals,
first and second gain controllers coupled to receive the output of the summing means,
third and fourth gain controllers coupled to receive the output of the differencing means,
a first, a second, a third and a fourth limiter coupled to receive the outputs of the first, second, third and fourth gain controllers respectively,
a first four-quadrant multiplier coupled to receive and multiply the outputs of the first and second limiters,
a second four-quadrant multiplier coupled to receive and multiply the outputs of the third and fourth limiters, and
means for adding the outputs of the first and second multipliers and outputting a focusing signal.

10. A dynamic focusing signal shaper according to claim 9 wherein the limiters comprise diodes.

11. A dynamic focusing signal shaper for generating a signal for adjusting focus in the corners of a cathode-ray-tube screen, the shaper comprising:
a source of horizontal deflection signal,
a source of vertical deflection signal,
means for summing the horizontal and vertical deflection signals,
means for differencing the horizontal and vertical deflection signals,
first and second diodes coupled with opposite polarity to receive the output of the summing means,
third and a fourth diodes coupled with opposite polarity to receive the output of the differencing means,
a first, a second, a third and a fourth variable resistor coupled to receive the outputs of the first, second, third and fourth diodes respectively,
a first four-quadrant multiplier coupled to receive and multiply the outputs of the first and second variable resistors,
a second four-quadrant multiplier coupled to receive and multiply the outputs of the third and fourth variable resistors, and
means for adding the outputs of the first and second multipliers and outputting a focusing signal.

12. A dynamic signal shaper for receiving horizontal and vertical deflection signals and generating a focus correction signal for application to a focus element of a cathode-ray tube, the shaper comprising:
means for summing the horizontal and vertical deflection signals,
means for differencing the horizontal and vertical deflection signals,
first and second limiters coupled to receive the output of the summing means,
third and fourth limiters coupled to receive the output of the differencing means,
a first multiplier coupled to receive and multiply the outputs of the first and second limiters,
a second multiplier coupled to receive and multiply the outputs of the third and fourth limiters, and
means for adding the outputs of the first and second multipliers and outputting the focus correction signal.

13. A signal shaper according to claim 12, wherein the first and third limiters have a gain of one for inputs greater than zero and a gain of zero for inputs less than zero and wherein the second and fourth limiters have a gain of zero for inputs greater than zero and a gain of one for inputs less than zero.

14. A dynamic signal shaper according to claim 13, wherein the limiters comprise diodes.

15. A dynamic signal shaper according to claim 12, including means for independently scaling the outputs provided by said limiters.

16. A dynamic signal shaper according to claim 15, wherein the means for independently scaling the outputs provided by the limiters comprise first, second, third and fourth gain controllers connected to receive the outputs of the first, second, third and fourth limiters respectively.

17. A dynamic signal shaper according to claim 16, wherein each gain controller is a variable resistor.

18. A dynamic signal shaper according to claim 12, wherein the first multiplier is coupled to form the square of the difference between the outputs of the first and second limiters and the second multiplier is coupled to form the square of the difference between the outputs of the third and fourth multipliers.

* * * * *